(12) United States Patent
Salters

(10) Patent No.: US 7,474,553 B2
(45) Date of Patent: Jan. 6, 2009

(54) DEVICE WRITING TO A PLURALITY OF ROWS IN A MEMORY MATRIX SIMULTANEOUSLY

(75) Inventor: Roelof Herman Willem Salters, Eindhoven (NL)

(73) Assignee: NXP B.V., Eindhoven (NL)

( * ) Notice: Subject to any disclaimer, the term of this patent is extended or adjusted under 35 U.S.C. 154(b) by 110 days.

(21) Appl. No.: 10/525,662

(22) PCT Filed: Jul. 31, 2003

(86) PCT No.: PCT/IB03/03729

§ 371 (c)(1),
(2), (4) Date: Feb. 25, 2005

(87) PCT Pub. No.: WO2004/021353

PCT Pub. Date: Mar. 11, 2004

(65) Prior Publication Data

US 2005/0254315 A1    Nov. 17, 2005

(30) Foreign Application Priority Data

Sep. 2, 2002  (EP) .................................. 02078590

(51) Int. Cl.
*G11C 11/00*  (2006.01)

(52) U.S. Cl. ...................................... 365/154; 365/156

(58) Field of Classification Search ................. 365/154, 365/156

See application file for complete search history.

(56) References Cited

U.S. PATENT DOCUMENTS

| | | | |
|---|---|---|---|
| 5,657,264 A * | 8/1997 | Yamauchi et al. | 365/49 |
| 6,275,415 B1 * | 8/2001 | Haddad et al. | 365/185.11 |
| 6,366,512 B1 * | 4/2002 | Yeh et al. | 365/203 |
| 6,954,396 B2 * | 10/2005 | Yamaoka et al. | 365/226 |
| 2003/0021168 A1 * | 1/2003 | Ishida et al. | 365/200 |
| 2003/0156485 A1 * | 8/2003 | Tomita et al. | 365/230.03 |

* cited by examiner

*Primary Examiner*—Hoai V Ho
*Assistant Examiner*—Anthan T Tran

(57) ABSTRACT

A word line driver circuit (10) is coupled to word lines (18) of a memory matrix, for example a matrix of content addressable cells (12). The word line driver circuit is capable of selecting a plurality of word lines simultaneously to permit writing into memory cells in a plurality of rows via the same bit line simultaneously. Cell strength control circuitry (17) reduces a drive strength required to write data into the cells, relative to a drive strength of the bit line driver circuits (15), at least during writing data into memory cells in a plurality of rows of memory cells. Preferably, the drive strength control circuitry (17) contain a resistive element in the power supply lines of the memory cells in a column, so that the supply voltage of the cells in the column is increasingly reduced when more current is drawn during writing of more cells simultaneously.

10 Claims, 3 Drawing Sheets

DEVICE WRITING TO A PLURALITY OF ROWS IN A MEMORY MATRIX SIMULTANEOUSLY

Figure 1:
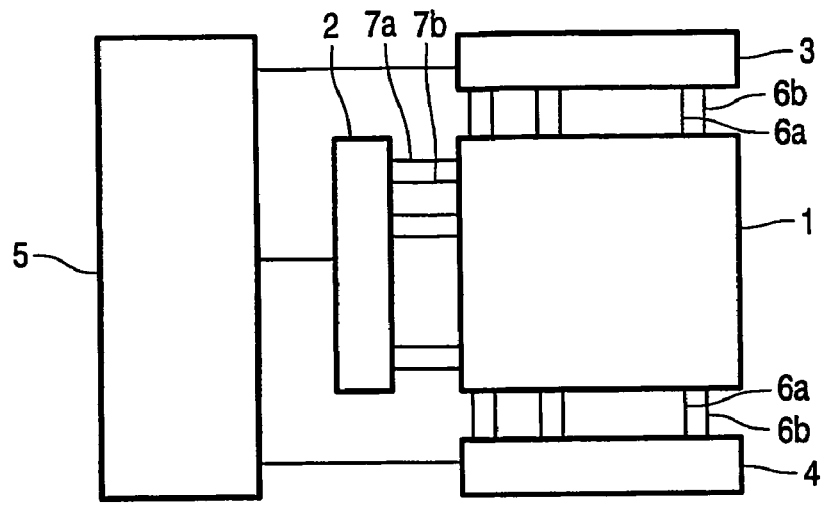

The invention relates to a device with a memory.

A semi-conductor memory is conventionally constructed using a matrix of memory cells that are arranged in rows and columns. Word line circuits and bit line circuits are provided for the rows and columns respectively. The word line circuit for a row comprises a word line to which selection inputs of the cells in the row are coupled in common. The bit line circuit for a column comprises a bit line to which data input/outputs of the cells in the column are coupled in parallel. During operation, one row is selected at a time via the word lines, making it possible to read data from, or write data to, the cells in the selected row via the bit lines.

In some memories is desirable to select a plurality of the rows at the same time, for writing the same data to the cells in that plurality of the rows in parallel. This is the case for example for content addressable memories (CAM's; also called associative memories). In such memories it is possible to supply pattern data and to detect in which of the rows the memory cells contain data that matches the pattern data. It is desirable to be able to write to the cells in all of the detected rows in parallel. For this purpose, the word line circuit comprises a word line driver arrangement that is capable of selecting the wordlines of the rows that have been detected to contain matching data Preferably all rows with matching data are selected simultaneously. This may lead to selection of a large number of wordlines in parallel. Similarly, in other types of memory it may be desirable to reset, preset or initialize the content of the cells in several rows simultaneously, by making the word line driver select more than one row simultaneously.

However, when a plurality of rows is selected simultaneously, a problem occurs with driving of the bit lines during writing. The bit line circuits contain bit-line driver circuits, which provide the data that must be written into the memory cells in the selected rows. The bit line driver circuits may have to drive a number of memory cells from different selected rows simultaneously. If the memory matrix has, say, 64 rows, it may be necessary to drive up to 64 cells to a new logic state simultaneously. This requires an excessively strong bit line driver circuit, which can make such a memory complex and expensive to manufacture. Moreover, such a strong driver circuit would lead to excessive power dissipation.

Among others, it is an object of the invention to provide for a device with a memory matrix in which it is possible to write into cells in a plurality of rows simultaneously via the same bit line, without requiring an excessively strong bit-line driver circuit.

The device according to the invention is set forth in Claim 1. According to the invention the required drive strengths that are required to store information in individual memory cells are reduced temporarily at least for all of those cells in a column into which data has to be written into simultaneously and at least when that data has to be written into the cells.

In an embodiment, the required drive strength is reduced by reducing the power supply voltage supplied at the power supply inputs of the cells in the column during writing. This is a simple and effective technique that does not require redesign of the memory cells.

In a further embodiment the power supply voltage is reduced by including a resistive element between an external power supply line and a power supply line that connects the power supply inputs of the cells. This ensures that the power supply voltage is automatically reduced more when data has to be overwritten in more cells, so that the required drive strength is adapted to the number of cells that has to be overwritten.

Preferably, separate power supply reduction circuits are provided for respective ones of the columns. Thus, the power supply reduction in each column is automatically adapted to the number of cells in the column in which data has to be changed. This avoids an unnecessary increase in the risk of changes in data in unselected cells.

Preferably the supply voltage of the bit line drivers is reduced in the same way as the supply voltage of the memory cells. This removes risk of damage to the cells during writing.

These and other objects and advantageous aspects of the device according to the invention will be described in more detail using the following figures.

Figure 1A:
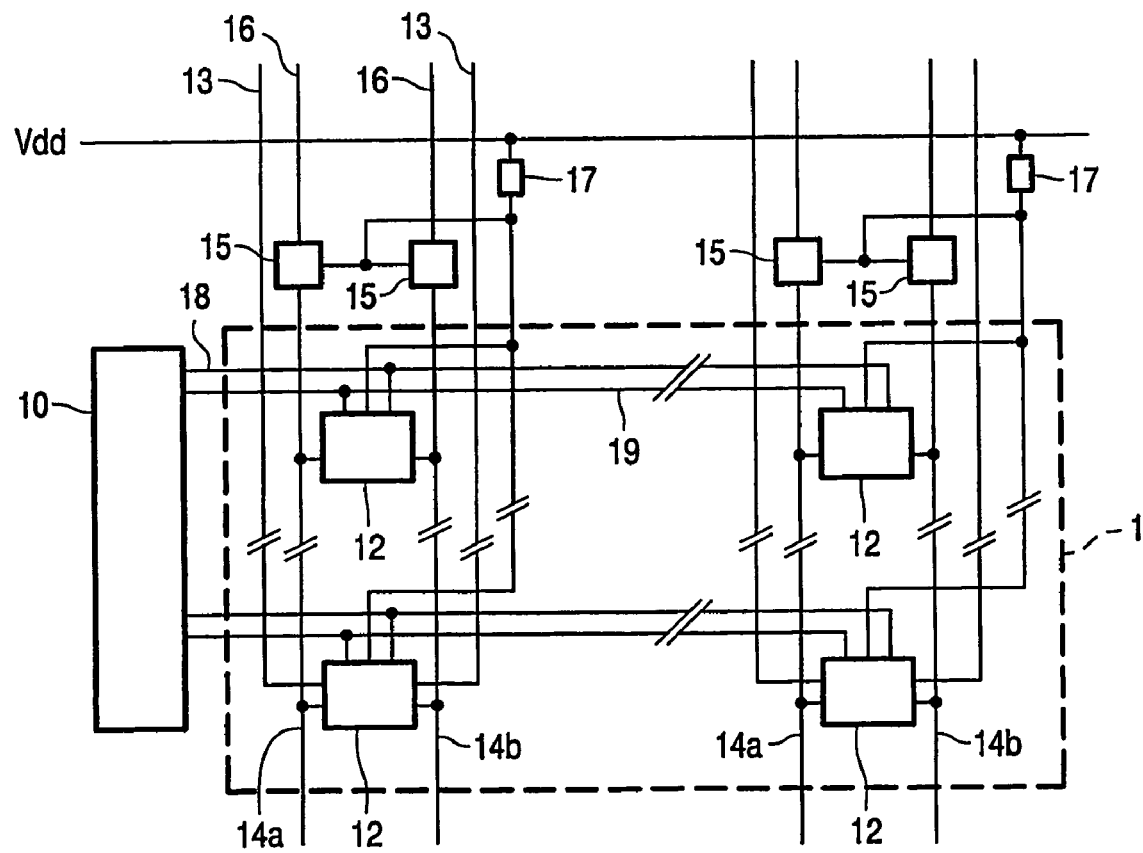
Figure 2:
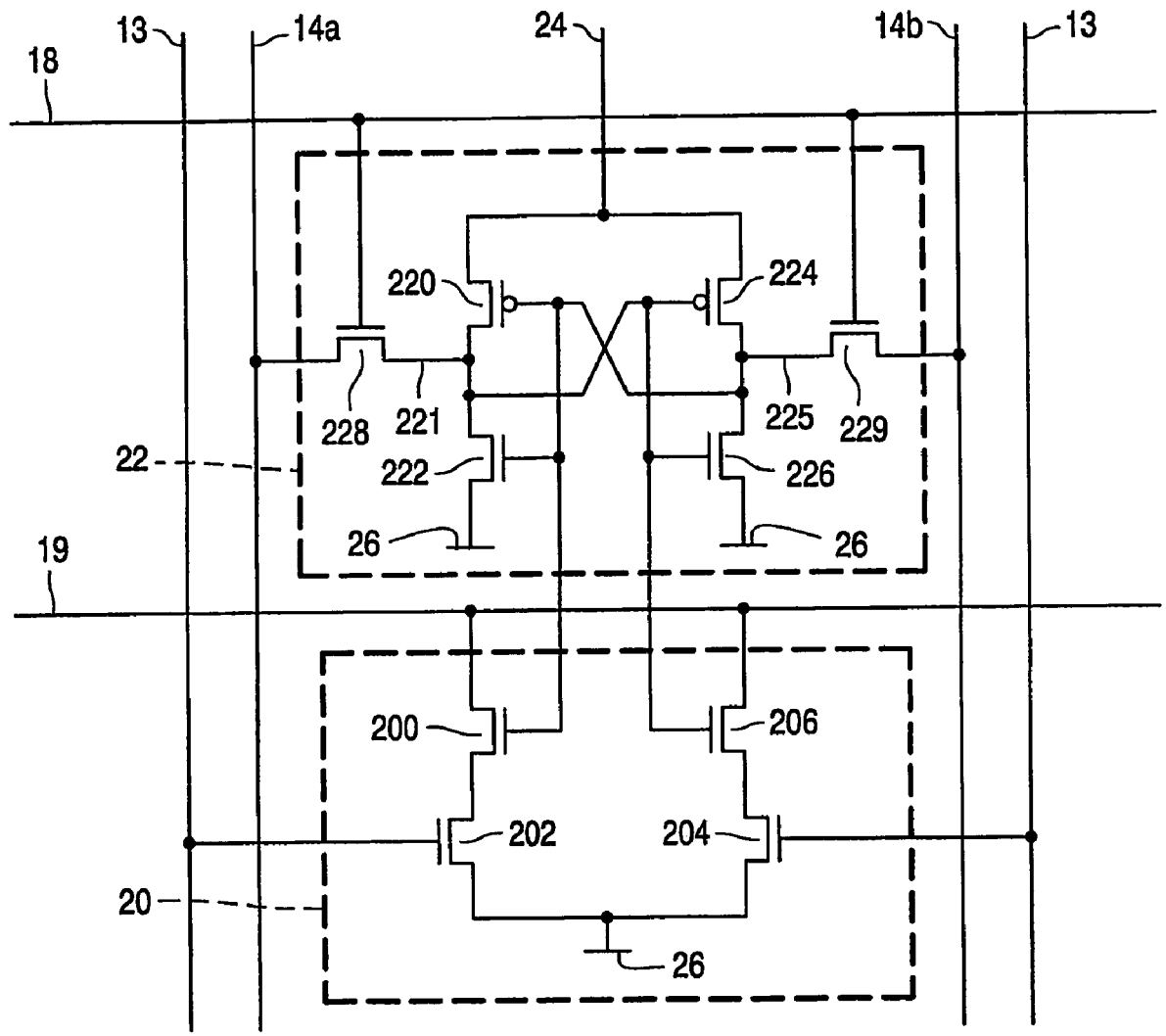
Figure 3:
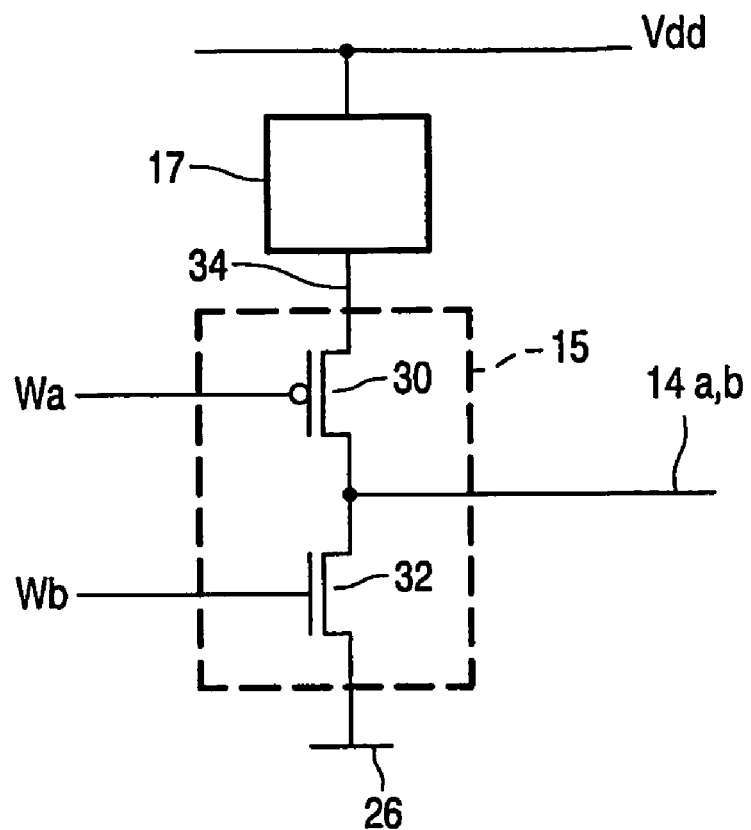
Figure 4:
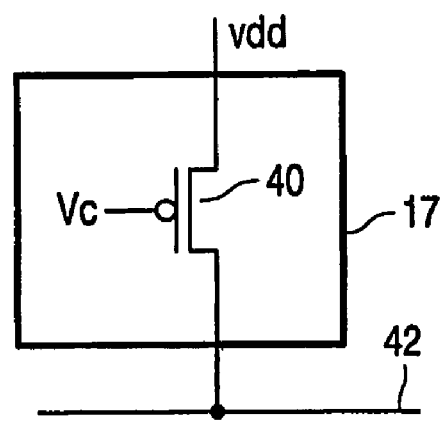

FIG. 1 shows a device with a matrix of memory cells
FIG. 1a shows a matrix in more detail
FIG. 2 shows a memory cell
FIG. 3 shows a driver circuit
FIG. 4 shows a power supply reduction circuit FIG. 1 shows a device with a matrix 1 of static memory cells, word line driver circuit 2, a write circuit 3, a read circuit 4 and a processing circuit 5. Write circuit 3 and read circuit 4 are coupled to the matrix 1 via bit lines 6a and match pattern lines 6b. Word line driver circuit 2 is coupled to matrix 1 via row selection lines 7a and flag lines 7b.

FIG. 1a shows an embodiment of matrix 1 for use in a content addressable memory in more detail. Matrix 1 contains static memory cells 12 arranged in rows and columns (only two rows and columns are shown for the sake of clarity, although in practice a much larger number of rows and columns may be used). For each column a bit line circuit comprising a pair of bit-lines 14a,b is present, as well as a pair of match pattern lines 13. The cells in the column are coupled to bit-lines 14a,b and match pattern lines 13 of the column. Write data inputs 16 are coupled to bit-lines 14a,b via bit-line drivers 15. For each row a word line circuit comprising a wordline 18 is present, as well as a flag line 19. The cells in the row are coupled to word line 18 and flag line 19 of the row. Flag lines 19 and word lines 18 of all rows are coupled to word line driver circuit 10.

A power supply line (Vdd) provides one pole of a power supply of matrix 1. For each column a power supply reduction circuit 17 is present, which is coupled between the power supply line (Vdd) on one hand and power supply inputs of cells 12 on the other hand. Power supply inputs of bit line drivers 15 of each column are coupled to the power supply reduction circuit of the column on the side of cells 12. In general cells 12 and bit line drivers 15 will also be coupled to other power supply connections (not shown for the sake of clarity, so that they operate powered by a voltage difference between the different power supply connections.

In operation processing circuit 5 performs a processing function that involves reading data from cells 12 and/or writing data to cells 12

The invention is illustrated for content based addressing. Although the principle of content based addressing is known per se and is not essential for understanding the invention, it will be explained briefly. For the purpose of content based addressing processing circuit 5 supplies an information pattern to memory cells 12 via the match pattern lines 6b. The information pattern is made up of a number of different bits, each applied to a different one of the match pattern lines 6b. The information pattern indicates which of the rows of cells 12 should be accessed: a row should be accessed when the content of the memory cells 12 in the row matches the information patter. In response to the information pattern flag signals are generated on flag lines 7b, by the memory cells 12 in the rows. The flag signals of the rows in which the content of the memory cells matches the information pattern assume one logical level and the flag signals of the other rows assume another logic level. In case of a write operation processing circuit 5 supplements the information pattern with write data and write circuit 3 applies this write data to bit lines 6a. Word line driver 2 selects the rows for which the flag signals indicated a match. As a result, the write data is stored in the memory cells 12 of those rows that contained matching data. Depending on the content of the memory cells and the information pattern the write data may have to be written into the memory cells of more than one row.

What is important for the invention is that content based addressing illustrates an application wherein at some stage during operation processing circuit 5 supplies data that may have to be copied to cells 12 in more than one of the rows. The number of rows into which data must be copied may not be known in advance (this is generally the case with content based addressing).

Referring now to FIG. 1a, during writing word line driver circuit 10 supplies select signals to the cells of the relevant rows simultaneously, for example on the basis of flag signals received from flag lines 19. Bit line drivers 15 drive the bit-lines 14a,b to overwrite the data in the cells 12 in those rows that are selected with word lines 18. Power supply reduction circuit 17 temporarily reduces the power supply voltage across cells 12 in memory matrix 1 at least during writing. As a result, the amount of current that is required to change the content of the memory cells 12 in the selected rows is reduced. Thus, it is possible to write data into the cells 12 with a less powerful driver 15 than would be required when the power supply voltage across cells 12 would not be reduced.

The power supply voltage that is applied to bit line drivers 15 is reduced at the same time when the power supply voltage of the cells 12 is reduced, so as to ensure that the output voltage of the bit line drivers 15 does not exceed the power supply voltage of the cells 12. This prevents damage to the cells 12. Of course, when there is no risk of damage, the bit line drivers 15 may be supplied with power directly, i.e. not via the power supply reduction circuit 17 of the cells 12 in matrix 1.

The power supply reduction circuits 17 are preferably implemented as resistive elements (for example resistors or transistors functioning as resistors).

FIG. 4 shows an embodiment of a power supply reduction circuit 17. The circuit contains a PMOS transistor 40, with its channel coupled between the external power supply Vdd and an internal power supply line 42 which is coupled to the power supply inputs of the cells (not shown) and the bit line driver (not shown). A gate of transistor 40 is coupled to a source of a control potential Vc, which is typically equal to a second power supply potential Vss of the two potentials Vdd, Vss between which the circuit receives power.

As a result the reduction in power supply voltage across cells 12 will increase as more current is drawn by the bit line drivers 15 and/or the cells 12 of a column. Thus, the reduction in power supply voltage is automatically adapted to the number of cells 12 in the column in which data has to be changed. Because separate power supply reduction circuits 17 are provided for each of the columns, the reduction in each column is adapted separately, according to the number of cells 12 in the column whose content has to be changed. Of course, a single power supply reduction circuit may be used for matrix 1 as a whole, or respective power supply reduction circuits may be used each time for a respective group of more than one column. In this case the supply voltage will also be reduced, making it possible to overwrite data, but this reduction would have to be more than necessary, with an increased risk that data in unselected cells 12 would be disturbed. By using separate power supply reduction circuits 17 for different groups of columns and preferably for different columns this risk is reduced.

In parallel with the resistive element, such as transistor 40, a short circuit switch (not shown, e.g. a further transistor) may be included. In this case, this switch may be controlled dependent on the access mode: during reading the circuit makes the switch conductive, so that the voltage drop across the resistive element is short circuited, whereas during writing and in any case during content based writing, when more than one row may be selected, the circuit makes the switch non-conductive so that a voltage drop develops when current is consumed to change over the content of the memory cells.

Instead of resistive elements other circuits may be used to implement power supply reduction circuit 17. For example an selectable voltage reduction circuit may be used, which receives a selection signal when data has to be written into cells 12 of matrix 1 and responds to the selection signal by increasing a voltage drop between the common supply line Vdd and the supply lines of cells 12. (An example of a selectable voltage reduction circuit is a source follower circuit that follows the selection signal). Preferably, in this case the amount of voltage reduction is adapted dependent on the number of selected rows, e.g. by supplying information derived from the flag lines to the selectable voltage reduction circuit. In this way the risk of a change of content of unselected cells is reduced. However, it will be appreciated that the use of a resistive element for this purpose is much less complex, and moreover makes it possible to adapt to the number of cells 12 in which data actually has to be overwritten, rather than the number of rows of cells 12 that is selected. Furthermore, a simple resistive element more easily fits into the column pitch defined by size of the memory cells transverse to the column direction of matrix 1.

FIG. 2 shows a memory cell. The cell contains a static storage part 22 and a matching part 20. Storage part contains a pair of cross-coupled inverters, each comprising a series connection of the channels of a PMOS transistor 220, 224 and an NMOS transistor between the power supply connections 24, 26 of the cell. In each inverter the gates of the PMOS transistor and the NMOS transistor are coupled together and to an output node 221, 225 that connects the channels of the PMOS transistor and NMOS transistor in the other inverter. The output nodes 221, 225 are coupled to the bit-lines 14a,b of the column to which the cell belongs via the channel of pass transistors 228, 229. The gates of the pass transistors 228, 229 are coupled to the word line 18 of the column to which the cell belongs.

Matching part 20 contains two branches, each with a series connection of channels of a first NMOS transistor 200, 206 and a second NMOS transistor 202, 204, the series connections being connected in parallel between the flag line 19 of the row of the matrix to which the cell belongs and one of the power supply connections 26. In each branch the first transistor 200, 206 has its gate coupled to a respective output node 221, 225 of the storage part and the second transistor 202, 204 has its gate connected to match a respective match pattern line 13 of the column to which the cell belongs.

In operation, static storage part 22 stores information in a conventional way, retaining data driven by the inverters. Match part pulls the potential of flag line 19 towards the potential of power supply line 26 when the data that is stored in memory part 20 corresponds to a bit pattern supplied on match pattern lines 13.

In more detail, the information pattern from processing circuit 5 determines the voltage applied to match pattern lines 13. Dependent on the content of the cell that is searched for, a high potential (sufficient to make the channel of one of the second transistors 202, 204 conductive) is applied to either a first one or a second one of the match pattern lines 13. The other match pattern line is kept at a low potential (sufficient to make the channel of the other second transistor 202, 204 non-conductive). If processing circuit 5 indicates that the content of the cell should not be considered during matching the potential of both match pattern lines 13 is kept low.

When both match pattern lines 13 are at a low potential neither one of the branches conducts and any voltage on flag line 19 is unaffected. When a match bit is applied to match pattern lines 13 the voltage of one of the match pattern lines 13 is raised (the required pattern determining of which match pattern line the voltage is raised). As a result the channel of the second transistor 202, 204 in one of the branches becomes conductive. Dependent on the data stored in storage part 22, the channel of the first transistor 200, 206 of the same branch may also become conductive. If so, that branch as a whole becomes conductive pulls the voltage of the flag line towards the potential of supply terminal 26.

Flag line 19 may be precharged for example and subsequently word line driver 10 detects whether flag line is discharged. This is the case when any of the cells in a row that does not receive low potentials on both match pattern lines contains data that deviates from a required bit value. Word line driver 10 uses the result of detection to determine whether the potential of word line 18 is raised. Thus, for example, the potential may be raised on the word lines 18 of all rows that did not discharge the flag line 19. (This may be realized for example by including a precharge circuit with switches (not shown) for respective ones of the rows and storage elements (not shown) for respective ones of the rows in the word line driver, the word line driver being clocked so that in a first clock phase the switches couple the flag lines to a precharge voltage source, the flag lines being left to float at the mercy of the cells in a second clock phase, the storage elements copying flag signals from the flag lines at the end of the second clock phase, the storage elements supplying a copy of the flag signal to the word lines in a third clock phase). During writing the potential of word lines 18 of all such rows may be raised at the same time by word line driver 10.

When the potential of word line 18 is raised the channels of pass transistors 228, 229 become conductive. During writing data driven onto bit lines 14a,b thus reaches the output nodes 221, 225 of the inverters. This forces the storage part to assume a state determined by the data that is driven onto bit lines 14a,b. When the data has to change, bit-line drivers 15 drive the potential of the output nodes 221, 225 against the inverters made up of transistors 220, 222, 224, 226.

The invention makes use of the fact that the strength with which the inverters (transistors 220, 222, 224, 226) drive the output nodes 221, 225 decreases with decreasing supply voltage across power supply terminals 24, 26 of storage part 22. In the extreme that the power supply voltage drops to a level near the threshold voltage of the transistors of transistors 220, 222, 224, 226. In this case, the transistors 220, 222, 224, 226 hardly conduct and the output nodes become little more than capacitive storage nodes. But also when some current can flow through the transistors 220, 222, 224, 226 the lowered gate source voltage reduces the drive strength of the transistors 220, 222, 224, 226. This means that driver circuits 15 need to supply less current to overturn the data in the storage part 22. This in turn means that the same driver circuits can overturn data in the storage parts 22 of more cells simultaneously.

The voltage drop across power supply reduction circuit 17 increases as the current drawn by the memory cells from different rows and the bit-line driver circuit increases. In the extreme it will increase to a point where little more than a threshold voltage remains across the power supply inputs of the memory cells, so that the power supply current through the memory cells nearly vanishes. The precise resistance value of the resistive element in power supply reduction circuit 17 is does not affect for this effect, as long as it is sufficiently large to cause a voltage drop to near the threshold voltage at least temporarily when the content of a large number of the memory cells has to be changed simultaneously. Also for other types of voltage reduction, a reduction to near the threshold voltage is more than sufficient.

Although the invention has been illustrated using one type of static memory cell, other types of static memory cells may be used, for example cells in which one transistor in each inverter in storage part 22 is replaced by a resistive element, or with inverters that contain the channels of more than two transistors in series.

FIG. 3 shows a bit line driver circuit 15 for use in the device. The driver circuit 15 is connected between the power supplies Vdd, 26, in series with the power supply reduction circuit 17. An internal power supply node 34 between the bit-line driver circuit 15 and power supply reduction circuit 17 supplies power to the cells of a column (not shown) and another driver circuit of the column (not shown) as well. The bit line driver circuit 15 contains a series connection of the channels of a PMOS pull-up transistor 30 and an NMOS pull-down transistor 32 between the internal power supply node 34 and power supply connection 26. The gates of PMOS transistor 30 and NMOS transistor 32 are coupled to an input Wa and an input Wb respectively, which are driven from write circuit 3 (not shown). An output node between the channels of PMOS transistor 30 and NMOS transistor 32 is coupled to bit line 14a,b. The output voltage at the output node is limited by the voltage supplied to the power supply inputs 24 of the memory cells. Thus, the cells are protected against damage.

In operation, during writing the write circuit drives inputs Wa, Wb with mutually opposite logical levels, so that one of PMOS transistor 30 and NMOS transistor 32 becomes conductive. Write circuit 3 derives the highest of these levels from Vdd, this highest level is unaffected by the voltage drop across the power supply reduction circuit 17. The bit-line drivers 15 that drive the bit-lines 14a,b of the same column receive mutually opposite input signals at their inputs Wa, Wb, so that one bit line driver 15 makes its bit line 14a,b logic high and the other makes its bit line logic low. When no writing is required the circuit controls the voltage at the inputs Wa, Wb so that both PMOS transistor 30 and NMOS transistor 32 remain non-conductive.

Usually, when two bit-lines 14a,b are used to write to the memory cell via NMOS pass transistors 228, 229, it is the bit line 14a, b that carries the lowest voltage which causes the content of the cell to change. The voltage at the other bit line 14a,b does not make its corresponding pass transistor 228, 229 conductive. Hence, it is the pull down transistor 32 of the bit line driver 15 of the bit line 14a,b with the lowest voltage that drives the cell 12 to a different state. The gate voltage of this pull down transistor 32 is not affected by the voltage drop across power supply reduction circuit 17. Therefore, the relevant drive strength of bit-line driver 15 is not affected by the voltage drop, whereas the relevant drive strength of the memory cells is affected. The same strength of bit line driver 15 is capable of driving a change of data in more than one cell simultaneously, because the current supply capacity of these memory cells is reduced by the voltage drop over power supply reduction circuit 17 during simultaneous writing. Of course the same effect pertain even when the drive strength of bit line driver is reduced during simultaneous writing, as long as the drive strength is reduced less than the required drive strength that is needed per memory cell 12.

The invention has been described in terms of a content addressable memory, in which data can be written to cells in a plurality of rows simultaneously, for which it is particularly useful since the number of such rows is generally data dependent. However, it should be understood that invention applies as well to other types of memory wherein it is desired to write data to cells in a plurality of rows simultaneously. For example to memories that permit reset or preset of the data in the entire memory or in groups of more than one row Although the invention has been illustrated in terms of power supply reduction circuits 17, which reduce the drive strength that is needed to change the data stored in memory cells 12, it will be understood that other means to reduce the drive strength that is needed to overturn data in the cells may be used. For example, additional transistors (not shown) may be included in storage part 20 to reduce the required drive strength. Such transistors may for example bring the inverters in storage part 22 in a relatively higher impedance output state (tri state circuit) during writing, or may increase the impedance between the gates of transistors 220, 222, 224, 226 and the output nodes 221, 225 during writing, the pass transistors being coupled to the gates of transistors 220, 222, 224, 226. In this case a write select output should be coupled to such additional transistors, for example to their gates, to increase the impedance during writing, at least in the cells of the rows that are selected with the word lines. However, this requires more complex memory cells, which makes the memory matrix larger, which may be a problem. Use of a reduction of the power supply voltage of the cells avoids this problem.

The invention claimed is:

1. A device with a memory, the device comprising
   a matrix of static memory cells functionally arranged in rows and columns;
   bit line circuits, each for writing data to memory cells in a respective one of the columns;
   a word line circuit constructed so that the word line circuit is capable of selecting memory cells in a plurality of the rows simultaneously to receive write data from the bit line driver circuits;
   cell strength control circuitry coupled to the cells and arranged to reduce a supply voltage applied to individual ones of the memory cells and hence to reduce drive strengths required to write data into the individual ones of the memory cells, relative to a drive strength of the bit line circuits, in dependence upon a number of memory cells being simultaneously written, at least during simultaneous writing of data into the memory cells in a plurality of the rows.

2. A device according to claim 1, wherein the cell strength control circuitry comprises a power supply reduction circuit coupled between a common power supply and an internal power supply line, the memory cells of at least one of the columns having power supply inputs coupled the internal power supply line, the power supply reduction circuit being arranged to provide a power supply voltage drop time-selectively at least during writing of data into the memory cells.

3. A device according to claim 2, wherein the power supply reduction circuit comprises a resistive element coupled between the common power supply and the internal power supply line.

4. A device according to claim 2, wherein the resistive element comprises a transistor, with a main current channel coupled between the common power supply and the internal power supply line.

5. A device according to claim 2, wherein the bit line circuit for the at least one of the columns comprises a bit-line driver circuit with a power supply input coupled to the internal power supply line.

6. A device according to claim 5, wherein the bit-line driver circuit has a control input coupled to receive a control voltage derived from the common power supply line, substantially unaffected by said drop.

7. A device according to claim 1, wherein the cell strength control circuitry comprises a plurality of power supply reduction circuits, each coupled between a common power supply and a respective internal power supply line, the memory cells in respective ones of the columns each having power supply inputs coupled a respective one of the internal power supply lines, each power supply reduction circuit being arranged to provide a respective power supply voltage drop on the respective one of the internal power supply lines to which that power supply reduction circuit is coupled, selectively at least during writing of data into the memory cells.

8. A device according to claim 7, wherein each power supply reduction circuit comprises a resistive element coupled between the common power supply and a respective one of the internal power supply lines.

9. A device according to claim 7, wherein the bit line circuit for each respective one of the columns comprises a respective bit-line driver circuit with a power supply input coupled to the internal power supply line of that respective one of the columns.

10. A device according to claim 9, wherein each bit-line driver circuit has a control input coupled to receive a control voltage derived from the common power supply line, substantially unaffected by said drop.

\* \* \* \* \*